United States Patent
Song et al.

(10) Patent No.: US 10,629,253 B2
(45) Date of Patent: Apr. 21, 2020

(54) SEMICONDUCTOR PACKAGE AND SEMICONDUCTOR SYSTEM RELATED TO PERFORMING A RESET OPERATION

(71) Applicant: SK hynix Inc., Icheon-si, Gyeonggi-do (KR)

(72) Inventors: Keun Soo Song, Icheon-si Gyeonggi-do (KR); Hongjoo Song, Icheon-si Gyeonggi-do (KR); Hae Kang Jung, Gwangmyeong-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 94 days.

(21) Appl. No.: 16/043,519

(22) Filed: Jul. 24, 2018

(65) Prior Publication Data
US 2019/0295624 A1    Sep. 26, 2019

(30) Foreign Application Priority Data
Mar. 22, 2018  (KR) .................. 10-2018-0033534

(51) Int. Cl.
*G11C 11/34* (2006.01)
*G11C 11/4072* (2006.01)
*G11C 5/14* (2006.01)
*G11C 11/4074* (2006.01)

(52) U.S. Cl.
CPC .......... *G11C 11/4072* (2013.01); *G11C 5/148* (2013.01); *G11C 11/4074* (2013.01)

(58) Field of Classification Search
CPC .. G11C 11/4072; G11C 5/148; G11C 11/4074
See application file for complete search history.

(56) References Cited

U.S. PATENT DOCUMENTS

| 6,937,494 | B2   |    8/2005 | Funaba et al. |
| 9,086,869 | B2 * |    7/2015 | Lee ........................ G06F 1/30 |
| 2010/0172049 | A1 * | 7/2010 | Lee ..................... G06F 3/0626 360/55 |
| 2010/0237902 | A1 * | 9/2010 | Sohn ................. H04L 25/0278 326/30 |
| 2014/0361816 | A1 * | 12/2014 | Sung ................... H03K 17/223 327/143 |
| 2016/0012865 | A1 * | 1/2016 | Lee ..................... G11C 29/028 365/51 |
| 2019/0079816 | A1 * | 3/2019 | Bang .................... G06F 11/006 |

FOREIGN PATENT DOCUMENTS

KR    1020100104686 A    9/2010

* cited by examiner

*Primary Examiner* — Toan K Le
(74) *Attorney, Agent, or Firm* — William Park & Associates Ltd.

(57) ABSTRACT

A semiconductor package for performing a reset operation includes a first semiconductor device including a first resistor element coupled to a reset pin, the first semiconductor device configured to be applied with a reset signal through the reset pin such that the reset operation is performed. The semiconductor package includes a second semiconductor device including a second resistor element coupled to the reset pin, the second semiconductor device configured to be applied with the reset signal through the reset pin such that the reset operation is performed. The first resistor element and the second resistor element may be selectively coupled to the reset pin when the reset operation is performed.

24 Claims, 11 Drawing Sheets

SEMICONDUCTOR PACKAGE AND SEMICONDUCTOR SYSTEM RELATED TO PERFORMING A RESET OPERATION

CROSS-REFERENCE TO RELATED APPLICATION

The present application claims priority under 35 U.S.C. § 119(a) to Korean Patent Application No. 10-2018-0033534 filed on Mar. 22, 2018 in the Korean Intellectual Property Office, which is incorporated herein by reference in its entirety.

BACKGROUND

1. Technical Field

Embodiments of the present disclosure generally relate to a semiconductor system, and more particularly, to a semiconductor system related to the performance of a reset operation.

2. Related Art

In general, a semiconductor system is configured to include a controller and a semiconductor package. The semiconductor package includes a plurality of semiconductor chips. The controller controls the operations of the plurality of semiconductor chips by providing an external voltage, a command and an address to the semiconductor package. The controller generates and applies a reset signal for the reset operation of the semiconductor devices included in the semiconductor package. The semiconductor devices perform the reset operation by receiving, through a pin, the reset signal applied from the controller.

SUMMARY

In an embodiment, a semiconductor package for performing a reset operation may include a first semiconductor device including a first resistor element coupled to a reset pin, the first semiconductor device configured to be applied with a reset signal through the reset pin such that the reset operation is performed. The semiconductor package may include a second semiconductor device including a second resistor element coupled to the reset pin, the second semiconductor device configured to be applied with the reset signal through the reset pin such that the reset operation is performed. The first resistor element and the second resistor element may be selectively coupled to the reset pin when the reset operation is performed.

In an embodiment, a semiconductor system for performing a reset operation may include a controller configured to output a power supply voltage, a reset signal and first and second switch control signals. The semiconductor system may include a semiconductor package including a first semiconductor chip, a second semiconductor chip and a reset pin, the first semiconductor chip including a first reset processing circuit configured to perform the reset operation by receiving the power supply voltage, the reset signal and the first switch control signal, the second semiconductor chip including a second reset processing circuit configured to perform the reset operation by receiving the power supply voltage, the reset signal and the second switch control signal, and the reset pin being coupled to one of a resistor element included in the first reset processing circuit or a resistor element included in the second reset processing circuit, based on the first switch control signal and the second switch control signal.

In an embodiment, a semiconductor system for performing a reset operation may include a controller configured to output a power supply voltage, a reset signal, first to fourth power switch control signals and first to fourth switch control signals. The semiconductor system may include a semiconductor package including a first semiconductor chip, a second semiconductor chip and a reset pin, the first semiconductor chip including a first reset processing circuit configured to perform the reset operation by receiving the power supply voltage, the reset signal, the first and second power switch control signals and the first and second switch control signals, the second semiconductor chip including a second reset processing circuit configured to perform the reset operation by receiving the power supply voltage, the reset signal, the third and fourth power switch control signals and the third and fourth switch control signals, and the reset pin being coupled to one among first and second resistor elements included in the first reset processing circuit and third and fourth resistor elements included in the second reset processing circuit, based on the first to fourth power switch control signals and the first to fourth switch control signals.

In an embodiment, a semiconductor system or performing a reset operation may include a controller configured to output a power supply voltage, a reset signal and first to fourth switch control signals, The semiconductor system may include a multi-chip package including a first semiconductor package, a second semiconductor package and a reset pin, the first semiconductor package including a first semiconductor chip and a second semiconductor chip, the second semiconductor package including a third semiconductor chip and a fourth semiconductor chip, the first semiconductor chip including a first reset processing circuit configured to perform the reset operation by receiving the power supply voltage, the reset signal and the first switch control signal, the second semiconductor chip including a second reset processing circuit configured to perform the reset operation by receiving the power supply voltage, the reset signal and the second switch control signal, the third semiconductor chip including a third reset processing circuit configured to perform the reset operation by receiving the power supply voltage, the reset signal and the third switch control signal, the fourth semiconductor chip including a fourth reset processing circuit configured to perform the reset operation by receiving the power supply voltage, the reset signal and the fourth switch control signal, and the reset pin being coupled to one of resistor elements included in the first to fourth reset processing circuits, based on the first to fourth switch control signals.

In an embodiment, a semiconductor system or performing a reset operation may include: a controller configured to output a power supply voltage, a reset signal, first to eighth power switch control signals and first to eighth switch control signals; and a multi-chip package including a first semiconductor package, a second semiconductor package and a reset pin, the first semiconductor package including a first semiconductor chip and a second semiconductor chip, the second semiconductor package including a third semiconductor chip and a fourth semiconductor chip, the first semiconductor chip including a first reset processing circuit configured to perform the reset operation by receiving the power supply voltage, the reset signal, the first and second power switch control signals and the first and second switch control signals, the second semiconductor chip including a second reset processing circuit configured to perform the reset operation by receiving the power supply voltage, the reset signal, the third and fourth power switch control signals and the third and fourth switch control signals, the third semiconductor chip including a third reset processing circuit configured to perform the reset operation by receiving the power supply voltage, the reset signal, the fifth and sixth power switch control signals and the fifth and sixth switch control signals, the fourth semiconductor chip including a fourth reset processing circuit configured to perform the reset operation by receiving the power supply voltage, the reset signal, the seventh and eighth power switch control signals and the seventh and eighth switch control signals, and the reset pin being coupled to one of resistor elements included in the first to fourth reset processing circuits, based on the first to eighth power switch control signals and the first to eighth switch control signals.

In an embodiment, a semiconductor package for performing a reset operation may include a reset pin configured to provide a reset signal. The semiconductor package may include a power pin configured to provide a power supply voltage. The semiconductor package may include a plurality of reset processing circuits each including a resistor element having one end coupled to the power pin and another end coupled to the reset pin through a first switch element. The only one first switch element from among the plurality of first switch elements may be closed when a reset operation is performed to couple an another end to the reset pin through the one first switch element.

DETAILED DESCRIPTION

Hereinafter, a semiconductor package and a semiconductor system for performing a reset operation will be described below with reference to the accompanying drawings through various examples of embodiments.

Various embodiments may be directed to a semiconductor package and a semiconductor system which perform a reset operation.

According to some embodiments, when a semiconductor package including a plurality of semiconductor chips performs a reset operation by being applied with a reset signal through a reset pin, by controlling the plurality of resistors included in the semiconductor chips not to be coupled simultaneously to the reset pin, advantages may be provided in that the reset pin may be stably driven by the reset signal.

Figure 1:
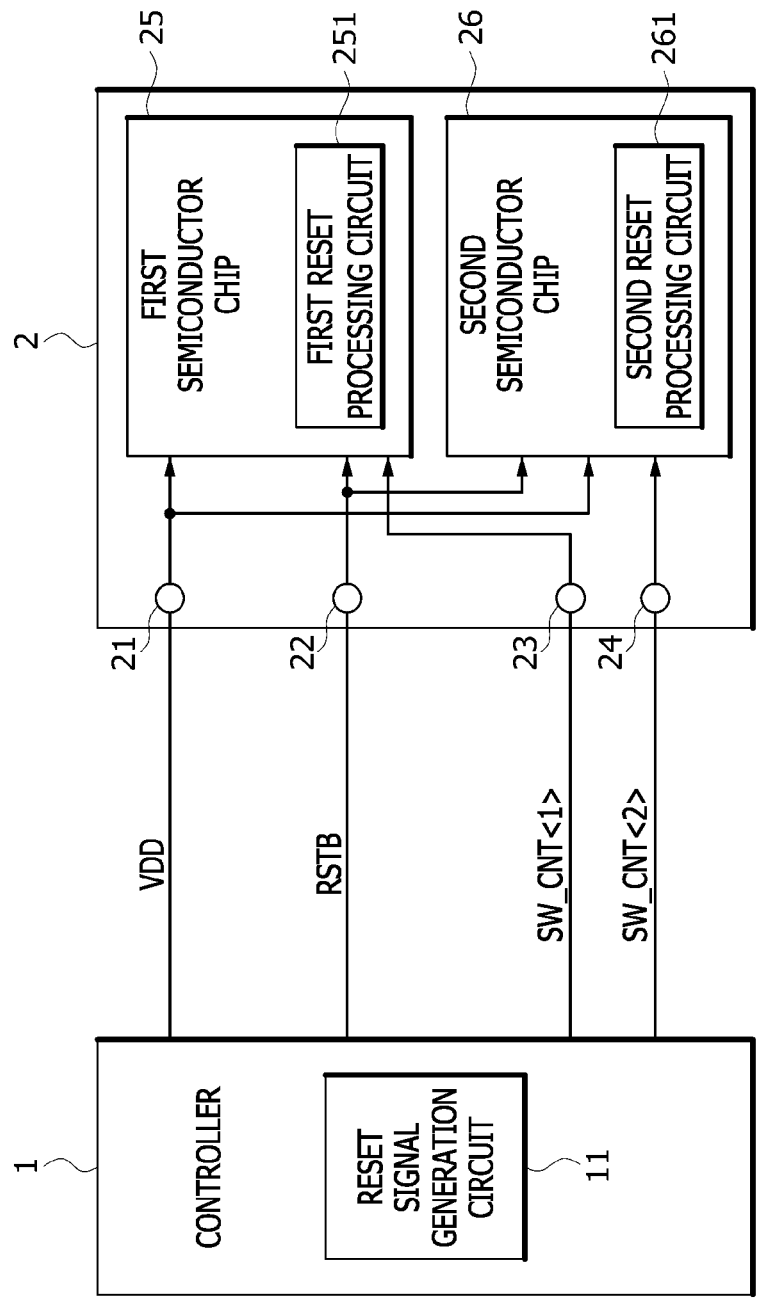
FIG. 1 is a block diagram illustrating a representation of an example of the configuration of a semiconductor system in accordance with an embodiment.

Referring to FIG. 1, a semiconductor system in accordance with an embodiment may include a controller 1 and a semiconductor package 2. The semiconductor package 2 may include a power pin 21, a reset pin 22, a first control pin 23, a second control pin 24, a first semiconductor chip 25 and a second semiconductor chip 26. In some embodiments, the semiconductor package 2 may include a first semiconductor device and a second semiconductor device. The first semiconductor device may be implemented by, for example but not limited to, a first semiconductor chip. The second semiconductor device may be implemented by, for example but not limited to, a second semiconductor chip. Additionally, the semiconductor package 2 may include more or less semiconductor chips or devices than what has been explained and illustrated herein, and the concepts discussed with regards to these semiconductor chips and devices are still consistent with the teachings and examples disclosed herein but now with more or less semiconductor chips or devices.

The controller 1 may apply a power supply voltage VDD, a reset signal RSTB and first and second switch control signals SW_CNT<1:2> to the semiconductor package 2. The controller 1 may include a reset signal generation circuit 11 which generates the reset signal RSTB. The configurations and operations of the reset signal generation circuit 11 will be described later with reference to FIG. 2.

The first semiconductor chip 25 may receive the power supply voltage VDD through the power pin 21. The first semiconductor chip 25 may receive the reset signal RSTB through the reset pin 22. The first semiconductor chip 25 may receive the first switch control signal SW_CNT<1> through the first control pin 23. The first semiconductor chip 25 may include a first reset processing circuit 251. The first reset processing circuit 251 may perform a reset operation in response to the reset signal RSTB and the first switch control signal SW_CNT<1>. The configurations and operations of the first reset processing circuit 251 will be described later with reference to FIG. 3.

The second semiconductor chip 26 may receive the power supply voltage VDD through the power pin 21. The second semiconductor chip 26 may receive the reset signal RSTB through the reset pin 22. The second semiconductor chip 26 may receive the second switch control signal SW_CNT<2> through the second control pin 24. The second semiconductor chip 26 may include a second reset processing circuit 261. The second reset processing circuit 261 may perform a reset operation in response to the reset signal RSTB and the second switch control signal SW_CNT<2>. The configurations and operations of the second reset processing circuit 261 will be described later with reference to FIG. 4.

Figure 2:
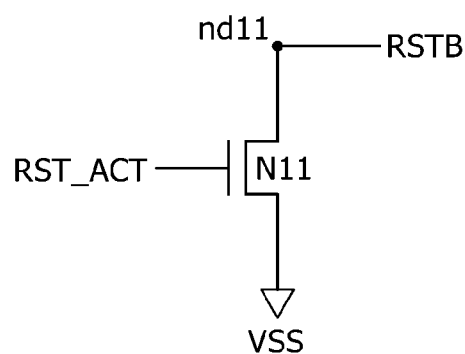
FIG. 2 is a circuit diagram illustrating a representation of an example of the reset signal generation circuit included in the semiconductor system illustrated in FIG. 1.

Referring to FIG. 2, the reset signal generation circuit 11 may include an NMOS transistor N11 which is coupled between a node nd11 and a ground voltage VSS. The NMOS transistor N11 may be turned on and drive the reset signal RSTB to a logic low level in the case where a reset activation signal RST_ACT is enabled to a logic high level. The reset activation signal RST_ACT may be enabled for the reset operation of the semiconductor package 2.

Figure 3:
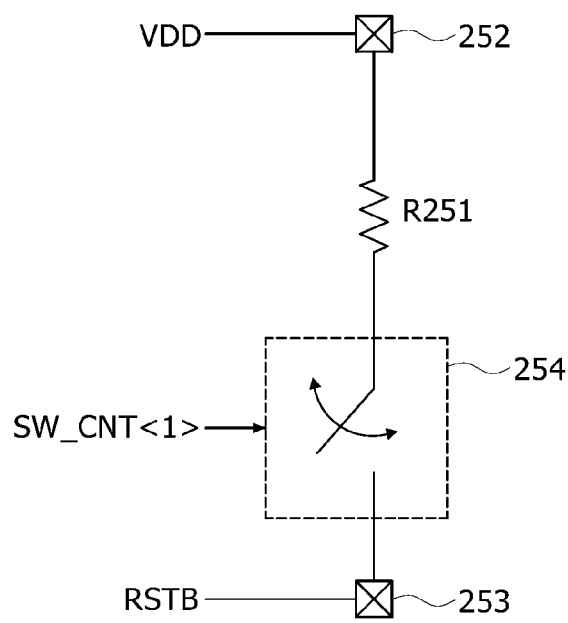
FIG. 3 is a circuit diagram illustrating a representation of an example of the first reset processing circuit included in the semiconductor system illustrated in FIG. 1.

Referring to FIG. 3, the first reset processing circuit 251 may include a pad 252 to which the power supply voltage VDD is applied and a pad 253 to which the reset signal RSTB is applied. The first reset processing circuit 251 may include a resistor element R251 and a switch element 254 which are coupled in series between the pad 252 and the pad 253. The switch element 254 may receive the first switch control signal SW_CNT<1> which is enabled to a logic high level, and thereby, couples the resistor element R251 to the pad 253.

Figure 4:
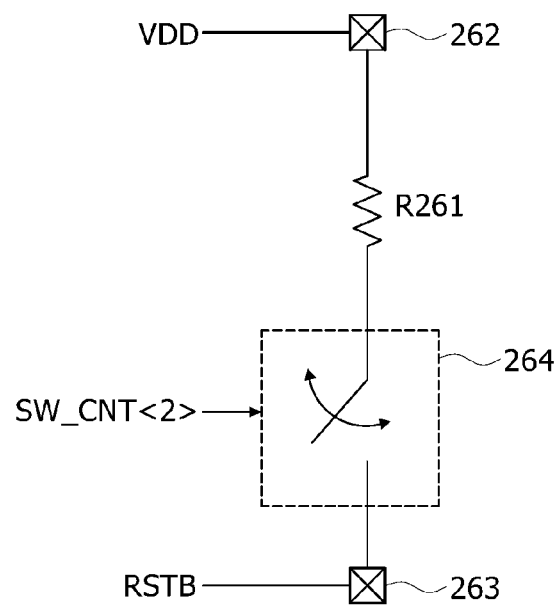
FIG. 4 is a circuit diagram illustrating a representation of an example of the second reset processing circuit included in the semiconductor system illustrated in FIG. 1.

Referring to FIG. 4, the second reset processing circuit 261 may include a pad 262 to which the power supply voltage VDD is applied and a pad 263 to which the reset signal RSTB is applied. The second reset processing circuit 261 may include a resistor element R261 and a switch element 264 which are coupled in series between the pad 262 and the pad 263. The switch element 264 may receive the second switch control signal SW_CNT<2> which is enabled to a logic high level, and thereby, couples the resistor element R261 to the pad 263.

In the semiconductor system configured as mentioned above, the controller 1 may perform the reset operation by transferring the reset signal RSTB which is enabled to the logic low level, to the first semiconductor chip 25 and the second semiconductor chip 26 through the reset pin 22. When the reset operation is performed, the controller 1 applies only one of the first switch control signal SW_CNT<1> and the second switch control signal SW_CNT<2> by enabling it to the logic high level, and thereby, prevents the resistor element R251 included in the first reset processing circuit 251 and the resistor element R261 included in the second reset processing circuit 261, from being coupled in parallel to the reset pin 22. That is to say, in the case where a plurality of resistor elements are coupled in parallel to the reset pin 22, the reset pin 22 is not properly driven even though the reset signal RSTB driven to the logic low level is applied. In this consideration, the controller 1 controls the enable states of the first switch control signal SW_CNT<1> and the second switch control signal SW_CNT<2> in such a manner that only one of the resistor element R251 and the resistor element R261 is coupled to the reset pin 22. For example, by applying the first and second switch control signals SW_CNT<1:2> through disabling the first switch control signal SW_CNT<1> to a logic low level and enabling the second switch control signal SW_CNT<2> to the logic high level, the controller 1 may control only the resistor element R261 to be coupled to the reset pin 22 such that the reset operation is performed by the reset signal RSTB.

Figure 5:
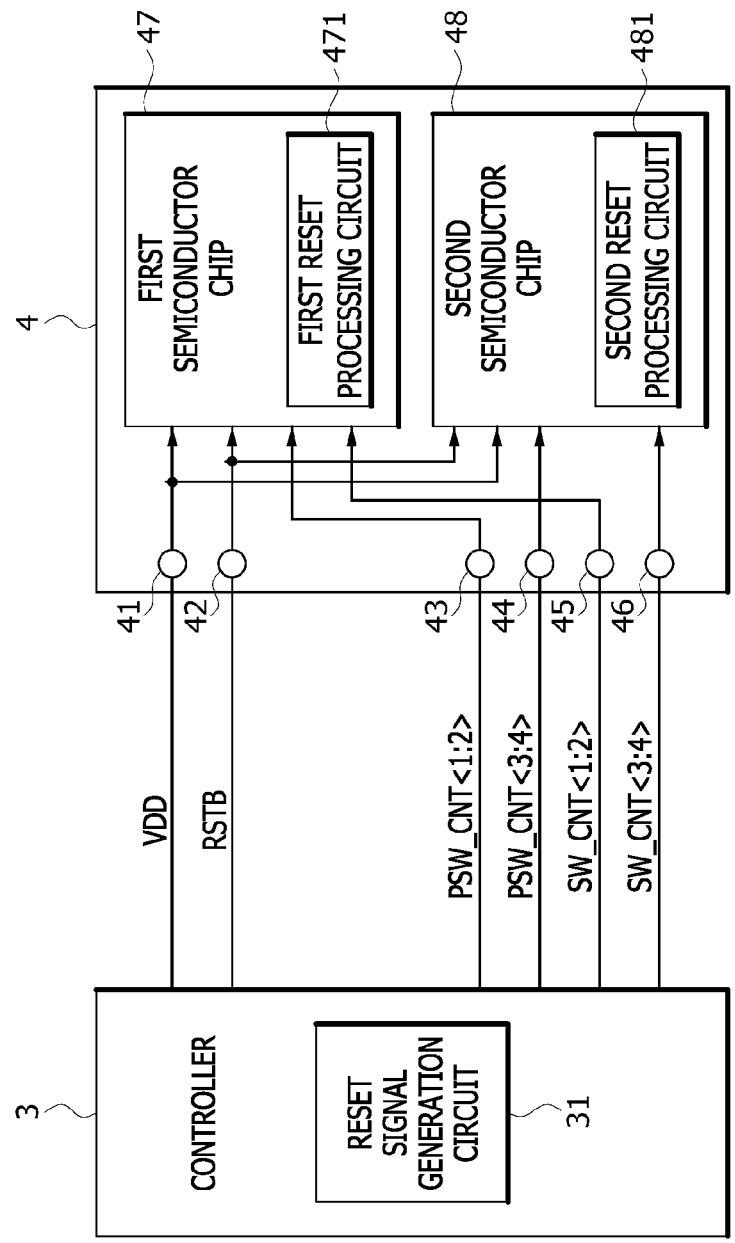
FIG. 5 is a block diagram illustrating a representation of an example of the configuration of a semiconductor system in accordance with other embodiments.

Referring to FIG. 5, a semiconductor system in accordance with other embodiments may include a controller 3 and a semiconductor package 4. The semiconductor package 4 may include a power pin 41, a reset pin 42, a first control pin 43, a second control pin 44, a third control pin 45, a fourth control pin 46, a first semiconductor chip 47 and a second semiconductor chip 48. In some embodiments, the semiconductor package 4 may include a first semiconductor device and a second semiconductor device. The first semiconductor device may be implemented by, for example but not limited to, a first semiconductor chip. The second semiconductor device may be implemented by, for example but not limited to, a second semiconductor chip. Additionally, the semiconductor package 4 may include more or less semiconductor chips or devices than what has been explained and illustrated herein, and the concepts discussed with regards to these semiconductor chips and devices are still consistent with the teachings and examples disclosed herein but now with more or less semiconductor chips or devices.

The controller 3 may apply a power supply voltage VDD, a reset signal RSTB, first to fourth power switch control signals PSW_CNT<1:4> and first to fourth switch control signals SW_CNT<1:4> to the semiconductor package 4. The controller 3 may include a reset signal generation circuit 31 which generates the reset signal RSTB. The configurations and operations of the reset signal generation circuit 31 will be described later with reference to FIG. 6.

The first semiconductor chip 47 may receive the power supply voltage VDD through the power pin 41, The first semiconductor chip 47 may receive the reset signal RSTB through the reset pin 42. The first semiconductor chip 47 may receive the first and second power switch control signals PSW_CNT<1:2> through the first control pin 43. The first and second power switch control signals PSW_CNT<1:2> may be inputted through a plurality of pins according to an embodiment. The first semiconductor chip 47 may receive the first and second switch control signals SW_CNT<1:2> through the third control pin 45. The first and second switch control signals SW_CNT<1:2> may be inputted through a plurality of pins according to an embodiment. The first semiconductor chip 47 may include a first reset processing circuit 471. The first reset processing circuit 471 may perform a reset operation in response to the reset signal RSTB, the first and second power switch control signals PSW_CNT<1:2> and the first and second switch control signals SW_CNT<1:2>. The configurations and operations of the first reset processing circuit 471 will be described later with reference to FIG. 7.

The second semiconductor chip 48 may receive the power supply voltage VDD through the power pin 41. The second semiconductor chip 48 may receive the reset signal RSTB through the reset pin 42. The second semiconductor chip 48 may receive the third and fourth power switch control signals PSW_CNT<3:4> through the second control pin 44. The third and fourth power switch control signals PSW_CNT<3:4> may be inputted through a plurality of pins according to an embodiment. The second semiconductor chip 48 may receive the third and fourth switch control signals SW_CNT<3:4> through the fourth control pin 46. The third and fourth switch control signals SW_CNT<3:4> may be inputted through a plurality of pins according to an embodiment. The second semiconductor chip 48 may include a second reset processing circuit 481. The second reset processing circuit 481 may perform a reset operation in response to the reset signal RSTB, the third and fourth power switch control signals PSW_CNT<3:4> and the third and fourth switch control signals SW_CNT<3:4>. The configurations and operations of the second reset processing circuit 481 will be described later with reference to FIG. 8.

Figure 6:
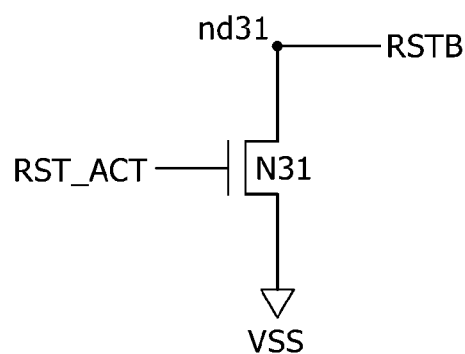
FIG. 6 is a circuit diagram illustrating a representation of an example of the reset signal generation circuit included in the semiconductor system illustrated in FIG. 5.

Referring to FIG. 6, the reset signal generation circuit 31 may include an NMOS transistor N31 which is coupled between a node nd31 and a ground voltage VSS. The NMOS transistor N31 may be turned on and drive the reset signal RSTB to a logic low level in the case where a reset activation signal RST_ACT is enabled to a logic high level. The reset activation signal RST_ACT may be enabled for the reset operation of the semiconductor package 4.

Figure 7:
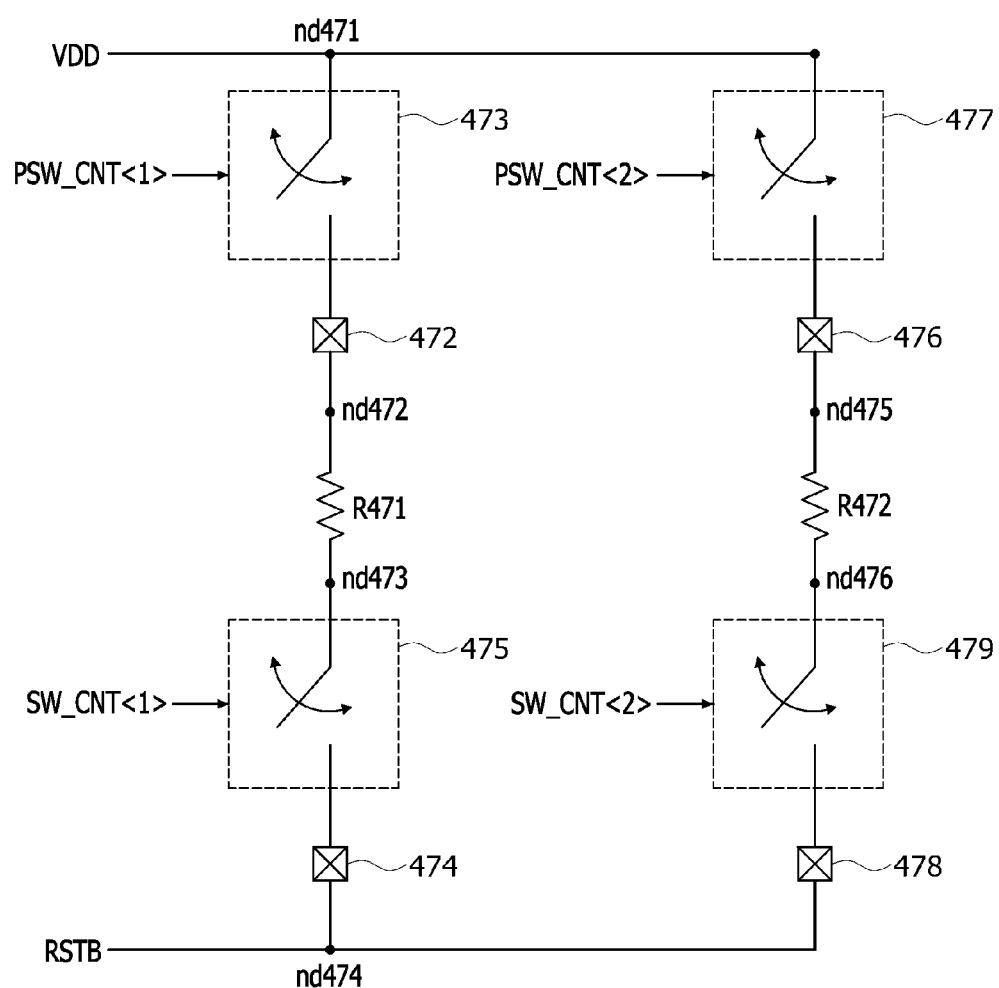
FIG. 7 is a circuit diagram illustrating a representation of an example of the first reset processing circuit included in the semiconductor system illustrated in FIG. 5.

Referring to FIG. 7, the first reset processing circuit 471 may include a node nd471 to which the power supply voltage VDD is applied and a node nd474 to which the reset signal RSTB is applied. The first reset processing circuit 471 may include a pad 472 which is coupled to a node nd472. The first reset processing circuit 471 may include a switch element 473 which is coupled between the node nd471 and the pad 472. The switch element 473 may receive the first power switch control signal PSW_CNT<1> which is enabled to a logic high level, and thereby, couples the node nd471 and the pad 472. The first reset processing circuit 471 may include a resistor element R471 which is coupled between the node nd472 and a node nd473. The first reset processing circuit 471 may include a pad 474 which is coupled to the node nd474. The first reset processing circuit 471 may include a switch element 475 which is coupled between the node nd473 and the pad 474. The switch element 475 may receive the first switch control signal SW_CNT<1> which is enabled to a logic high level, and thereby, couples the node nd473 and the pad 474. The first reset processing circuit 471 may include a pad 476 which is coupled to a node nd475. The first reset processing circuit 471 may include a switch element 477 which is coupled between the node nd471 and the pad 476. The switch element 477 may receive the second power switch control signal PSW_CNT<2> which is enabled to a logic high level, and thereby, couples the node nd471 and the pad 476. The first reset processing circuit 471 may include a resistor element R472 which is coupled between the node nd475 and a node nd476. The first reset processing circuit 471 may include a pad 478 which is coupled to the node nd474, The first reset processing circuit 471 may include a switch element 479 which is coupled between the node nd476 and the pad 478. The switch element 479 may receive the second switch control signal SW_CNT<2> which is enabled to a logic high level, and thereby, couples the node nd476 and the pad 478.

Figure 8:
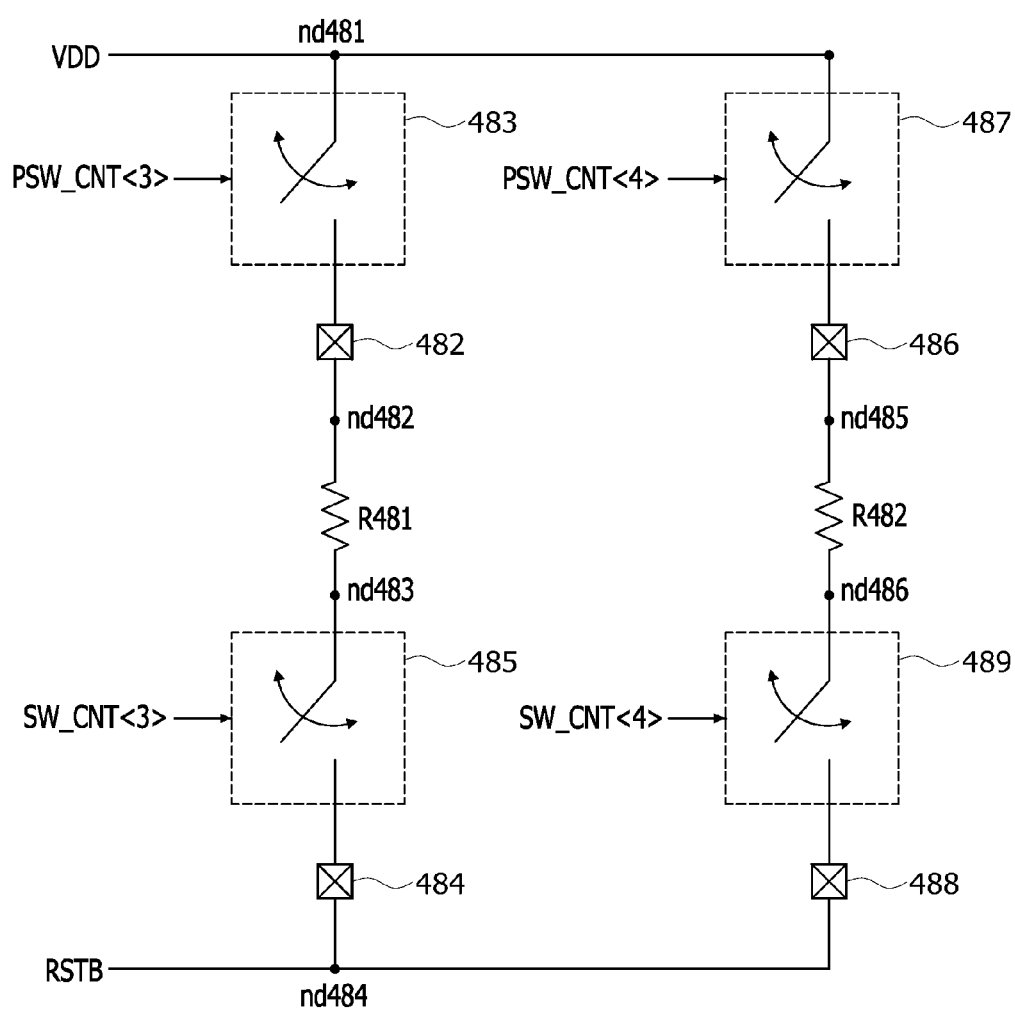
FIG. 8 is a circuit diagram illustrating a representation of an example of the second reset processing circuit included in the semiconductor system illustrated in FIG. 5.

Referring to FIG. 8, the second reset processing circuit 481 may include a node nd481 to which the power supply voltage VDD is applied and a node nd484 to which the reset signal RSTB is applied. The second reset processing circuit 481 may include a pad 482 which is coupled to a node nd482. The second reset processing circuit 481 may include a switch element 483 which is coupled between the node nd481 and the pad 482. The switch element 483 may receive the third power switch control signal PSW_CNT<3> which is enabled to a logic high level, and thereby, couples the node nd481 and the pad 482. The second reset processing circuit 481 may include a resistor element R481 which is coupled between the node nd482 and a node nd483. The second reset processing circuit 481 may include a pad 484 which is coupled to the node nd484. The second reset processing circuit 481 may include a switch element 485 which is coupled between the node nd483 and the pad 484. The switch element 485 may receive the third switch control signal SW_CNT<3> which is enabled to a logic high level, and thereby, couples the node nd483 and the pad 484. The second reset processing circuit 481 may include a pad 486 which is coupled to a node nd485. The second reset processing circuit 481 may include a switch element 487 which is coupled between the node nd481 and the pad 486. The switch element 487 may receive the fourth switch control signal PSW_CNT<4> which is enabled to a logic high level, and thereby, couples the node nd481 and the pad 486. The second reset processing circuit 481 may include a resistor element R482 which is coupled between the node nd485 and a node nd486. The second reset processing circuit 481 may include a pad 488 which is coupled to the node nd484. The second reset processing circuit 481 may include a switch element 489 which is coupled between the node nd486 and the pad 488. The switch element 489 may receive the fourth switch control signal SW_CNT<4> which is enabled to a logic high level, and thereby, couple the node nd486 and the pad 488.

In the semiconductor system configured as mentioned above, the controller 3 may perform the reset operation by transferring the reset signal RSTB which is enabled to the logic low level, to the first semiconductor chip 47 and the second semiconductor chip 48 through the reset pin 42. When the reset operation is performed, the controller 3 applies only one of the first to fourth power switch control signals PSW_CNT<1:4> by enabling it to the logic high level and applies only one of the first to fourth switch control signals SW_CNT<1:4> by enabling it to the logic high level, and thereby, prevents two or more among the resistor elements R471 and R472 included in the first reset processing circuit 471 and the resistor elements R481 and R482 included in the second reset processing circuit 481, from being coupled in parallel to the reset pin 42. That is to say, in the case where a plurality of resistor elements are coupled in parallel to the reset pin 42, the reset pin 42 may not be properly driven even though the reset signal RSTB driven to the logic low level is applied. In this consideration, the controller 3 controls the enable states of the first to fourth power switch control signals PSW_CNT<1:4> and the first to fourth switch control signals SW_CNT<1:4> in such a manner that only one of the resistor elements R471, R472, R481 and R482 is coupled to the reset pin 42. For example, by applying the second power switch control signal PSW_CNT<2> and the second switch control signal SW_CNT<2> through enabling them to the logic high levels, the controller 3 may control only the resistor element R472 to be coupled to the reset pin 42 such that the reset operation is performed by the reset signal RSTB.

Figure 9:
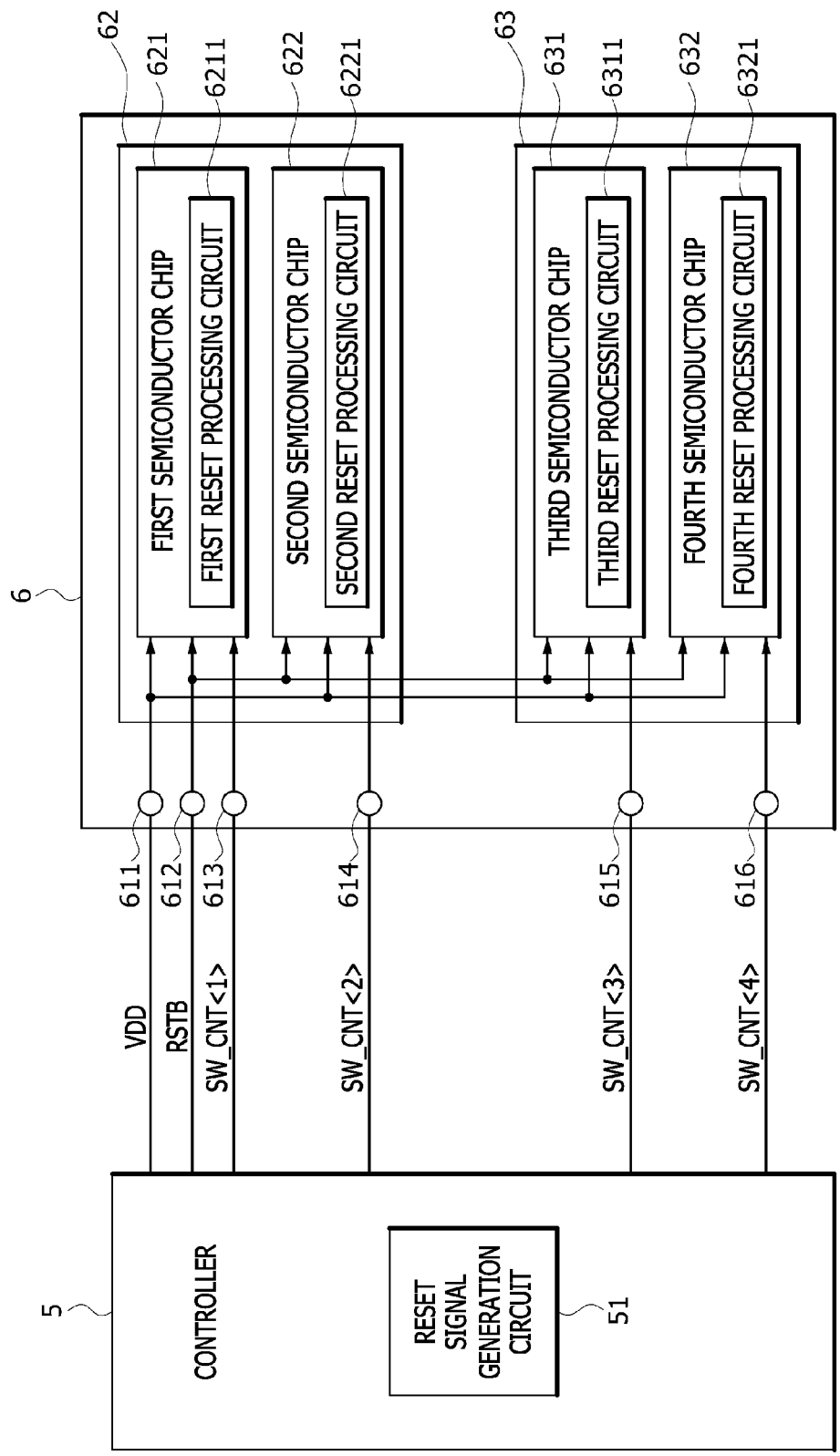
FIG. 9 is a block diagram illustrating a representation of an example of the configuration of a semiconductor system in accordance with other embodiments.

Referring to FIG. 9, a semiconductor system in accordance with other embodiments may include a controller 5 and a multi-chip package 6. The multi-chip package 6 may include a power pin 611, a reset pin 612, a first control pin 613, a second control pin 614, a third control pin 615, a fourth control pin 616, a first semiconductor package 62 and a second semiconductor package 63. The first semiconductor package 62 may include a first semiconductor chip 621 and a second semiconductor chip 622. The second semiconductor package 63 may include a third semiconductor chip 631 and a fourth semiconductor chip 632. In some embodiments, the multi-chip package may include more or less semiconductor packages and the semiconductor packages may include more or less semiconductor chips than what is illustrated in FIG. 9 and discussed. In fact, the concepts discussed with regards to these semiconductor packages and or semiconductor chips are still consistent with the teachings and examples disclosed herein but now with more or less semiconductor chips.

The controller 5 may apply a power supply voltage VDD, a reset signal RSTB and first to fourth switch control signals SW_CNT<1:4> to the multi-chip package 6. The controller 5 may include a reset signal generation circuit 51 which generates the reset signal RSTB. The reset signal generation circuit 51 may be realized by the same circuit as the reset signal generation circuit 11 illustrated in FIG. 2 or the reset signal generation circuit 31 illustrated in FIG. 6.

The first semiconductor chip 621 may receive the power supply voltage VDD through the power pin 611. The first semiconductor chip 621 may receive the reset signal RSTB through the reset pin 612. The first semiconductor chip 621 may receive the first switch control signal SW_CNT<1> through the first control pin 613. The first semiconductor chip 621 may include a first reset processing circuit 6211. The first reset processing circuit 6211 may perform a reset operation in response to the reset signal RSTB and the first switch control signal SW_CNT<1>. The first reset processing circuit 6211 may be realized by the same circuit as the first reset processing circuit 251 illustrated in FIG. 3 or the second reset processing circuit 261 illustrated in FIG. 4.

The second semiconductor chip 622 may receive the power supply voltage VDD through the power pin 611. The second semiconductor chip 622 may receive the reset signal RSTB through the reset pin 612. The second semiconductor chip 622 may receive the second switch control signal SW_CNT<2> through the second control pin 614. The second semiconductor chip 622 may include a second reset processing circuit 6221. The second reset processing circuit 6221 may perform a reset operation in response to the reset signal RSTB and the second switch control signal SW_CNT<2>. The second reset processing circuit 6221 may be realized by the same circuit as the first reset processing circuit 251 illustrated in FIG. 3 or the second reset processing circuit 261 illustrated in FIG. 4.

The third semiconductor chip 631 may receive the power supply voltage VDD through the power pin 611. The third semiconductor chip 631 may receive the reset signal RSTB through the reset pin 612. The third semiconductor chip 631 may receive the third switch control signal SW_CNT<3> through the third control pin 615. The third semiconductor chip 631 may include a third reset processing circuit 6311. The third reset processing circuit 6311 may perform a reset operation in response to the reset signal RSTB and the third switch control signal SW_CNT<3>. The third reset processing circuit 6311 may be realized by the same circuit as the first reset processing circuit 251 illustrated in FIG. 3 or the second reset processing circuit 261 illustrated in FIG. 4.

The fourth semiconductor chip 632 may receive the power supply voltage VDD through the power pin 611. The fourth semiconductor chip 632 may receive the reset signal RSTB through the reset pin 612. The fourth semiconductor chip 632 may receive the fourth switch control signal SW_CNT<4> through the fourth control pin 616. The fourth semiconductor chip 632 may include a fourth reset processing circuit 6321. The fourth reset processing circuit 6321 may perform a reset operation in response to the reset signal RSTB and the fourth switch control signal SW_CNT<4>. The fourth reset processing circuit 6321 may be realized by the same circuit as the first reset processing circuit 251 illustrated in FIG. 3 or the second reset processing circuit 261 illustrated in FIG. 4.

In the semiconductor system configured as mentioned above, the controller 5 may perform a reset operation by transferring the reset signal RSTB which is enabled to a logic low level, to the first semiconductor chip 621, the second semiconductor chip 622, the third semiconductor chip 631 and the fourth semiconductor chip 632 through the reset pin 612. When the reset operation is performed, the controller 5 applies only one of the first to fourth switch control signals SW_CNT<1:4> by enabling it to a logic high level, and thereby, prevents the resistor elements included in the first reset processing circuit 6211, the second reset processing circuit 6221, the third reset processing circuit 6311 and the fourth reset processing circuit 6321, from being coupled in parallel to the reset pin 612. That is to say, in the case where a plurality of resistor elements are coupled in parallel to the reset pin 612, the reset pin 612 is not properly driven even though the reset signal RSTB driven to the logic low level is applied. In this consideration, the controller 5 controls the enable states of the first to fourth switch control signals SW_CNT<1:4> in such a manner that only one resistor element is coupled to the reset pin 612.

Figure 10:
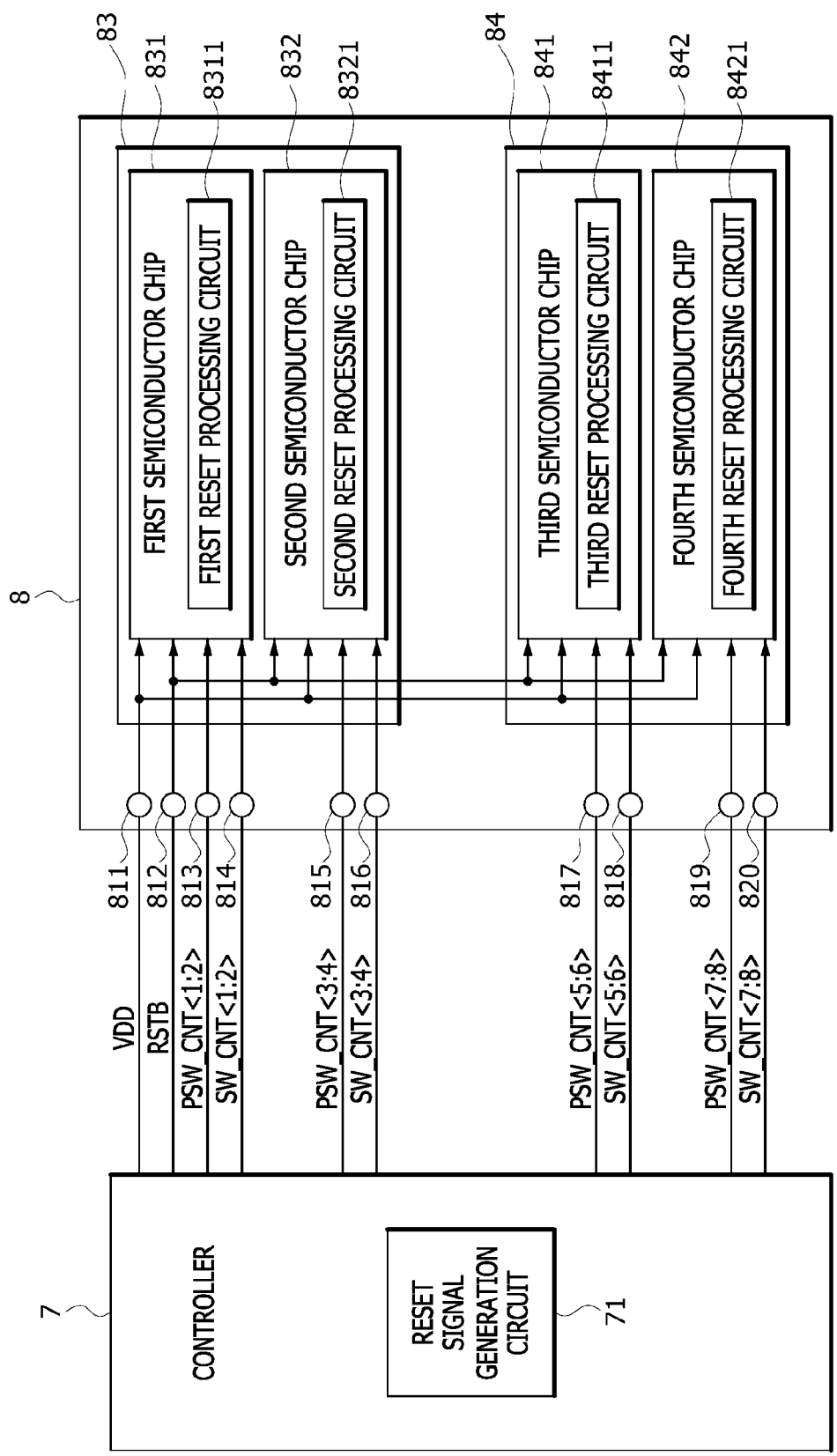
FIG. 10 is a block diagram illustrating a representation of an example of the configuration of a semiconductor system in accordance with other embodiments.

Referring to FIG. 10, a semiconductor system in accordance with other embodiments may include a controller 7 and a multi-chip package 8. The multi-chip package 8 may include a power pin 811, a reset pin 812, a first control pin 813, a second control pin 814, a third control pin 815, a fourth control pin 816, a fifth control pin 817, a sixth control pin 818, a seventh control pin 819, an eighth control pin 820, a first semiconductor package 83 and a second semiconductor package 84. The first semiconductor package 83 may include a first semiconductor chip 831 and a second semiconductor chip 832. The second semiconductor package 84 may include a third semiconductor chip 841 and a fourth semiconductor chip 842. In some embodiments, the multi-chip package may include more or less semiconductor packages and the semiconductor packages may include more or less semiconductor chips than what is illustrated in FIG. 10 and discussed. In fact, the concepts discussed with regards to these semiconductor packages and or semiconductor chips are still consistent with the teachings and examples disclosed herein but now with more or less semiconductor chips.

The controller 7 may apply a power supply voltage VDD, a reset signal RSTB, first to eighth power switch control signals PSW_CNT<1:8> and first to eighth switch control signals SW_CNT<1:8> to the multi-chip package 8. The controller 7 may include a reset signal generation circuit 71 which generates the reset signal RSTB. The reset signal generation circuit 71 may be realized by the same circuit as the reset signal generation circuit 11 illustrated in FIG. 2 or the reset signal generation circuit 31 illustrated in FIG. 6.

The first semiconductor chip 831 may receive the power supply voltage VDD through the power pin 811. The first semiconductor chip 831 may receive the reset signal RSTB through the reset pin 812. The first semiconductor chip 831 may receive the first and second power switch control signals PSW_CNT<1:2> through the first control pin 813. The first and second power switch control signals PSW_CNT<1:2> may be inputted through a plurality of pins according to an embodiment. The first semiconductor chip 831 may receive the first and second switch control signals SW_CNT<1:2> through the second control pin 814. The first and second switch control signals SW_CNT<1:2> may be inputted through a plurality of pins according to an embodiment. The first semiconductor chip 831 may include a first reset processing circuit 8311. The first reset processing circuit 8311 may perform a reset operation in response to the reset signal RSTB, the first and second power switch control signals PSW_CNT<1:2> and the first and second switch control signals SW_CNT<1:2>. The first reset processing circuit 8311 may be realized by the same circuit as the first reset processing circuit 471 illustrated in FIG. 7 or the second reset processing circuit 481 illustrated in FIG. 8.

The second semiconductor chip 832 may receive the power supply voltage VDD through the power pin 811. The second semiconductor chip 832 may receive the reset signal RSTB through the reset pin 812. The second semiconductor chip 832 may receive the third and fourth power switch control signals PSW_CNT 3:4> through the third control pin 815. The third and fourth power switch control signals PSW_CNT<3:4> may be inputted through a plurality of pins according to an embodiment. The second semiconductor chip 832 may receive the third and fourth switch control signals SW_CNT<3:4> through the fourth control pin 816. The third and fourth switch control signals SW_CNT<3:4> may be inputted through a plurality of pins according to an embodiment. The second semiconductor chip 832 may include a second reset processing circuit 8321. The second reset processing circuit 8321 may perform a reset operation in response to the reset signal RSTB, the third and fourth power switch control signals PSW_CNT<3:4> and the third and fourth switch control signals SW_CNT<3:4>. The second reset processing circuit 8321 may be realized by the same circuit as the first reset processing circuit 471 illustrated in FIG. 7 or the second reset processing circuit 481 illustrated in FIG. 8.

The third semiconductor chip 841 may receive the power supply voltage VDD through the power pin 811. The third semiconductor chip 841 may receive the reset signal RSTB through the reset pin 812. The third semiconductor chip 841 may receive the fifth and sixth power switch control signals PSW_CNT<5:6> through the fifth control pin 817, The fifth and sixth power switch control signals PSW_CNT<5:6> may be inputted through a plurality of pins according to an embodiment. The third semiconductor chip 841 may receive the fifth and sixth switch control signals to SW_CNT<5:6> through the sixth control pin 818. The fifth and sixth switch control signals SW_CNT<5:6> may be inputted through a plurality of pins according to an embodiment. The third semiconductor chip 841 may include a third reset processing circuit 8411. The third reset processing circuit 8411 may perform a reset operation in response to the reset signal RSTB, the fifth and sixth power switch control signals PSW_CNT<5:6> and the fifth and sixth switch control signals SW_CNT<5:6>. The third reset processing circuit 8411 may be realized by the same circuit as the first reset processing circuit 471 illustrated in FIG. 7 or the second reset processing circuit 481 illustrated in FIG. 8.

The fourth semiconductor chip 842 may receive the power supply voltage VDD through the power pin 811. The fourth semiconductor chip 842 may receive the reset signal RSTB through the reset pin 812. The fourth semiconductor chip 842 may receive the seventh and eighth power switch control signals PSW_CNT<7:8> through the seventh control pin 819. The seventh and eighth power switch control signals PSW_CNT<7:8> may be inputted through a plurality of pins according to an embodiment. The fourth semiconductor chip 842 may receive the seventh and eighth switch control signals SW_CNT<7:8> through the eighth control pin 820. The seventh and eighth switch control signals SW_CNT<7:8> may be inputted through a plurality of pins according to an embodiment. The fourth semiconductor chip 842 may include a fourth reset processing circuit 8421. The fourth reset processing circuit 8421 may perform a reset operation in response to the reset signal RSTB, the seventh and eighth power switch control signals PSW_CNT<7:8> and the seventh and eighth switch control signals SW_CNT<7:8>. The fourth reset processing circuit 8421 may be realized by the same circuit as the first reset processing circuit 471 illustrated in FIG. 7 or the second reset processing circuit 481 illustrated in FIG. 4.

In the semiconductor system configured as mentioned above, the controller 7 may perform a reset operation by transferring the reset signal RSTB which is enabled to a logic low level, to the first semiconductor chip 831, the second semiconductor chip 832, the third semiconductor chip 841 and the fourth semiconductor chip 842 through the reset pin 812. When the reset operation is performed, the controller 7 applies only one of the first to eighth power switch control signals PSW_CNT<1:8> by enabling it to a logic high level and applies only one of the first to eighth switch control signals SW_CNT<1:8> by enabling it to a logic high level, and thereby, prevents two or more among the resistor elements included in the first reset processing circuit 8311, the second reset processing circuit 8321, the third reset processing circuit 8411 and the fourth reset processing circuit 8421, from being coupled in parallel to the reset pin 812. That is to say, in the case where a plurality of resistor elements are coupled in parallel to the reset pin 812, the reset pin 812 is not properly driven even though the reset signal RSTB driven to the logic low level is applied. In this consideration, the controller 7 controls the enable states of the first to eighth power switch control signals PSW_CNT<1:8> and the first to eighth switch control signals SW_CNT<1:8> in such a manner that only one resistor element is coupled to the reset pin 812.

Figure 11:
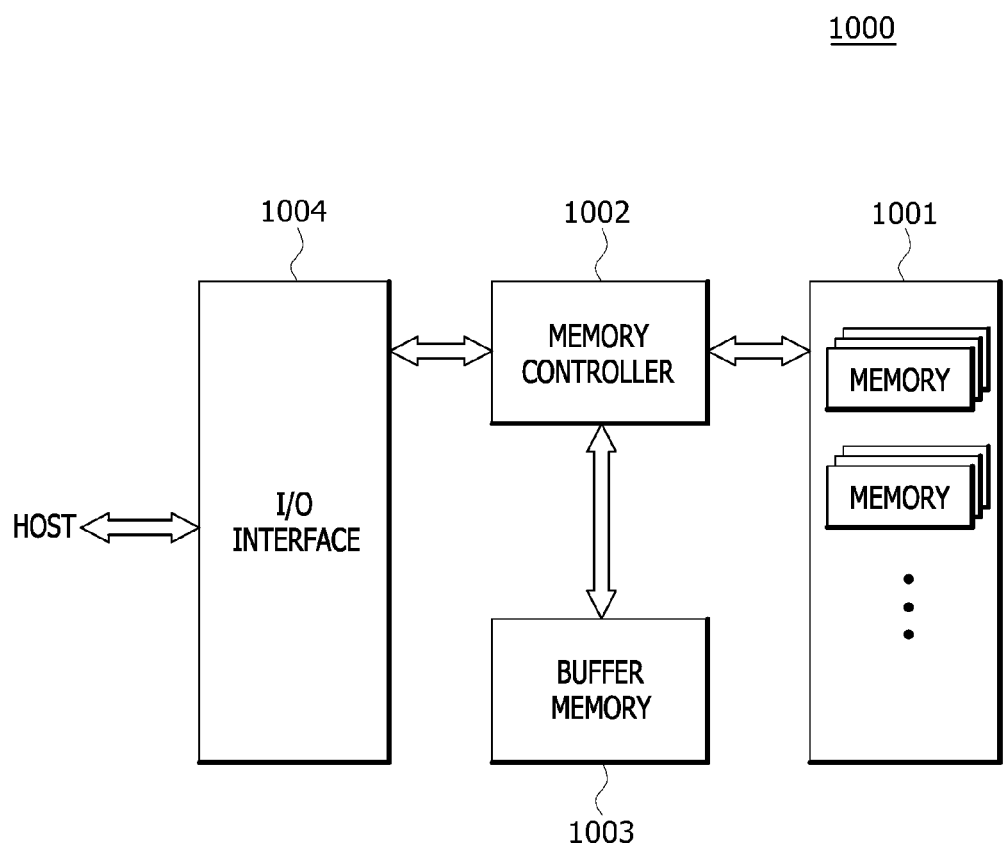
FIG. 11 is a diagram illustrating a representation of an example of the configuration of an electronic system to which each of the semiconductor devices illustrated in FIGS. 1 and 5 is applied.

The semiconductor systems described above with reference to FIGS. 1 to 10 may be applied to an electronic system which includes a memory system, a graphic system, a computing system or a mobile system. For example, referring to FIG. 11, an electronic system 1000 in accordance with an embodiment may include a data storage 1001, a memory controller 1002, a buffer memory 1003, and an input/output interface 1004.

The data storage 1001 stores data applied from the memory controller 1002, and reads out stored data and outputs the read-out data to the memory controller 1002, according to control signals from the memory controller 1002. The data storage 1001 may include a nonvolatile memory capable of not losing and continuously storing data even though power supply is interrupted. A nonvolatile memory may be realized as a flash memory such as a NOR flash memory and a NAND flash memory, a phase change random access memory (PRAM), a resistive random access memory (RRAM), a spin transfer torque random access memory (STTRAM) or a magnetic random access memory (MRAM).

The memory controller 1002 decodes commands applied through the input/output interface 1004 from an external device (a host), and controls input/output of data with respect to the data storage 1001 and the buffer memory 1003 according to decoding results. While the memory controller 1002 is illustrated as one block in FIG. 11, a controller for controlling the data storage 1001 and a controller for controlling the buffer memory 1003 as a volatile memory may be independently configured in the memory controller 1002.

The buffer memory 1003 may temporarily store data to be processed in the memory controller 1002, that is, data to be inputted and outputted to and from the data storage 1001. The buffer memory 1003 may store data applied from the memory controller 1002 according to a control signal. The buffer memory 1003 reads out stored data and outputs the read-out data to the memory controller 1002. The buffer memory 1003 may include a volatile memory such as a DRAM (dynamic random access memory), a mobile DRAM and an SRAM (static random access memory).

The input/output interface 1004 provides a physical coupling between the memory controller 1002 and the external device (the host) such that the memory controller 1002 may receive control signals for input/output of data from the external device and exchange data with the external device. The input/output interface 1004 may include one among various interface protocols such as USB, MMC, PCI-E, SAS, SATA, PATA, SCSI, ESDI and IDE.

The electronic system 1000 may be used as an auxiliary memory device or an external storage device of the host. The electronic system 1000 may include a solid state disk (SSD), a USB memory (universal serial bus memory), a secure digital (SD) card, a mini-secure digital (mSD) card, a micro SD card, a secure digital high capacity (SDRC) card, a memory stick card, a smart media (SM) card, a multimedia card (MMC), an embedded MMC (eMMC), or a compact flash (CF) card.

While various embodiments have been described above, it will be understood to those skilled in the art that the embodiments described are by way of example only. Accordingly, the semiconductor package and the semiconductor system for performing a reset operation described herein should not be limited based on the described embodiments.

What is claimed is:

1. A semiconductor package for performing a reset operation, comprising:
    a first semiconductor device including a first resistor element coupled to a reset pin, the first semiconductor device configured to be applied with a reset signal through the reset pin such that the reset operation is performed; and
    a second semiconductor device including a second resistor element coupled to the reset pin, the second semiconductor device configured to be applied with the reset signal through the reset pin such that the reset operation is performed,
    wherein the first resistor element and the second resistor element are selectively coupled to the reset pin when the reset operation is performed.

2. The semiconductor package according to claim 1, wherein the first semiconductor device includes a first reset processing circuit, the first reset processing circuit configured to perform the reset operation by receiving a power supply voltage, the reset signal, and a first switch control signal.

3. The semiconductor package according to claim 2, wherein the first reset processing circuit includes the first resistor element and a first switch element coupled between a first pad to which the power supply voltage is supplied and a second pad to which the reset signal is applied, and the first switch element couples the first resistor element and the second pad when the first switch control signal is enabled.

4. The semiconductor package according to claim 2, wherein the second semiconductor device includes a second reset processing circuit, the second reset processing circuit configured to perform the reset operation by receiving the power supply voltage, the reset signal, and a second switch control signal.

5. The semiconductor package according to claim 4, wherein only one of the first switch control signal or the second switch control signal is enabled is performed in the reset operation for a period when the reset signal is enabled.

6. A semiconductor system for performing a reset operation, comprising:
    a controller configured to output a power supply voltage, a reset signal, and first and second switch control signals; and
    a semiconductor package including a first semiconductor chip, a second semiconductor chip, and a reset pin, the first semiconductor chip including a first reset processing circuit configured to perform the reset operation by receiving the power supply voltage, the reset signal, and the first switch control signal, the second semiconductor chip including a second reset processing circuit configured to perform the reset operation by receiving the power supply voltage, the reset signal, and the second switch control signal, and the reset pin being coupled to one of a resistor element included in the first reset processing circuit or a resistor element included in the second reset processing circuit, based on the first switch control signal and the second switch control signal.

7. The semiconductor system according to claim 6, wherein the controller includes a reset signal generation circuit configured to generate the reset signal, and the reset signal generation circuit includes a metal-oxide semiconductor (MOS) transistor configured to drive a node from which the reset signal is outputted, to a ground voltage, based on a reset activation signal.

8. The semiconductor system according to claim 6, wherein only one of the first switch control signal or the second switch control signal is enabled is performed in the reset operation for a period when the reset signal is enabled.

9. The semiconductor system according to claim 6, wherein the first reset processing circuit includes a first resistor element and a first switch element coupled between a first pad to which the power supply voltage is supplied and a second pad to which the reset signal is applied, and the first switch element couples the first resistor element and the second pad when the first switch control signal is enabled.

10. The semiconductor system according to claim 9, wherein the second reset processing circuit includes a second resistor element and a second switch element coupled between a third pad to which the power supply voltage is supplied and a fourth pad to which the reset signal is applied, and the second switch element couples the second resistor element and the fourth pad when the second switch control signal is enabled.

11. A semiconductor system for performing a reset operation, comprising:
    a controller configured to output a power supply voltage, a reset signal, first to fourth power switch control signals, and first to fourth switch control signals; and
    a semiconductor package including a first semiconductor chip, a second semiconductor chip, and a reset pin, the first semiconductor chip including a first reset processing circuit configured to perform the reset operation by receiving the power supply voltage, the reset signal, the first and second power switch control signals, and the first and second switch control signals, the second semiconductor chip including a second reset processing circuit configured to perform the reset operation by receiving the power supply voltage, the reset signal, the third and fourth power switch control signals, and the third and fourth switch control signals, and the reset pin being coupled to one among first and second resistor elements included in the first reset processing circuit and third and fourth resistor elements included in the second reset processing circuit, based on the first to fourth power switch control signals and the first to fourth switch control signals.

12. The semiconductor system according to claim 11, wherein the controller includes a reset signal generation circuit configured to generate the reset signal, and the reset signal generation circuit includes a metal-oxide semiconductor (MOS) transistor configured to drive a node from which the reset signal is outputted, to a ground voltage, based on a reset activation signal.

13. The semiconductor system according to claim 11, wherein only one of the first to fourth power switch control signals and only one of the first to fourth switch control signals are enabled is performed in the reset operation for a period when the reset signal is enabled.

14. The semiconductor system according to claim 11, wherein the first reset processing circuit includes a first node, a second node, first and second pads, first and second switch elements, and the first resistor element, the first node is supplied with the power supply voltage, the second node is applied with the reset signal, the first pad is coupled to a third node, the first switch element is coupled to the first pad and the first node, the first resistor element is coupled to the third node and a fourth node, the second pad is coupled to the second node, the second switch element is coupled to the second pad and the fourth node, the first switch element couples the first pad and the first node based on the first power switch control signal, and the second switch element couples the second pad and the fourth node based on the first switch control signal.

15. The semiconductor system according to claim 14, wherein the first reset processing circuit includes third and fourth pads, third and fourth switch elements, and the second resistor element, the third pad is coupled to a fifth node, the third switch element is coupled to the third pad and the first node, the second resistor element is coupled to the fifth node and a sixth node, the fourth pad is coupled to the second node, the fourth switch element is coupled to the fourth pad and the sixth node, the third switch element couples the third pad and the first node based on the second power switch control signal, and the fourth switch element couples the fourth pad and the sixth node based on the second switch control signal.

16. The semiconductor system according to claim 11, wherein the second reset processing circuit includes a first node, a second node, first and second pads, first and second switch elements and the third resistor element, the first node is supplied with the power supply voltage, the second node is applied with the reset signal, the first pad is coupled to a third node, the first switch element is coupled to the first pad and the first node, the third resistor element is coupled to the third node and a fourth node, the second pad is coupled to the second node, the second switch element is coupled to the second pad and the fourth node, the first switch element couples the first pad and the first node based on the third power switch control signal, and the second switch element couples the second pad and the fourth node based on the third switch control signal.

17. The semiconductor system according to claim 16, wherein the second reset processing circuit includes third and fourth pads, third and fourth switch elements and the fourth resistor element, the third pad is coupled to a fifth node, the third switch element is coupled to the third pad and the first node, the fourth resistor element is coupled to the fifth node and a sixth node, the fourth pad is coupled to the second node, the fourth switch element is coupled to the fourth pad and the sixth node, the third switch element couples the third pad and the first node based on the fourth power switch control signal, and the fourth switch element couples the fourth pad and the sixth node based on the fourth switch control signal.

18. A semiconductor system for performing a reset operation, comprising:
a controller configured to output a power supply voltage, a reset signal, and first to fourth switch control signals; and
a multi-chip package including a first semiconductor package, a second semiconductor package, and a reset pin, the first semiconductor package including a first semiconductor chip and a second semiconductor chip, the second semiconductor package including a third semiconductor chip and a fourth semiconductor chip, the first semiconductor chip including a first reset processing circuit configured to perform the reset operation by receiving the power supply voltage, the reset signal, and the first switch control signal, the second semiconductor chip including a second reset processing circuit configured to perform the reset operation by receiving the power supply voltage, the reset signal, and the second switch control signal, the third semiconductor chip including a third reset processing circuit configured to perform the reset operation by receiving the power supply voltage, the reset signal and the third switch control signal, the fourth semiconductor chip including a fourth reset processing circuit configured to perform the reset operation by receiving the power supply voltage, the reset signal and the fourth switch control signal, and the reset pin being coupled to one of resistor elements included in the first to fourth reset processing circuits, based on the first to fourth switch control signals.

19. The semiconductor system according to claim 18, wherein the controller includes a reset signal generation circuit configured to generate the reset signal, and the reset signal generation circuit includes a metal-oxide semiconductor (MOS) transistor configured to drive a node from which the reset signal is outputted, to a ground voltage, based on a reset activation signal.

20. The semiconductor system according to claim 18, wherein only one of the first to fourth switch control signals is enabled is performed in the reset operation for a period when the reset signal is enabled.

21. A semiconductor package for performing a reset operation, comprising:
a reset pin configured to provide a reset signal;
a power pin configured to provide a power supply voltage; and
a plurality of reset processing circuits each including a resistor element having one end coupled to the power pin and another end coupled to the reset pin through a first switch element,
wherein only one first switch element from among the plurality of first switch elements is closed when a reset operation is performed to couple an another end to the reset pin through the one first switch element.

22. The semiconductor package according to claim 21, wherein each of the first switch elements is configured to receive a switch control signal, respectively, and
wherein only the one first switch element from among the plurality of first switch elements is closed based on the switch control signals when the reset operation is performed.

23. The semiconductor package according to claim 21, wherein the plurality of reset processing circuits each further comprise a second switch element coupled between the power pin and the one end of the resistor element, and
wherein only one second switch element from among the plurality of second switch elements is closed when the reset operation is performed to couple the one end to the power pin through the one second switch element.

24. The semiconductor package according to claim 23, wherein each of the second switch elements is configured to receive a switch control signal, respectively, and wherein only the one second switch element from among the plurality of second switch elements is closed based on the switch control signals when the reset operation is performed.

* * * * *